United States Patent
Xia et al.

(10) Patent No.: US 9,023,223 B2
(45) Date of Patent: May 5, 2015

(54) SPATIALLY-CONTROLLED SYNTHESIS OF PALLADIUM—RHODIUM HETERO-NANOSTRUCTURES

(71) Applicants: Younan Xia, Atlanta, GA (US); Shuifen Xie, Atlanta, GA (US)

(72) Inventors: Younan Xia, Atlanta, GA (US); Shuifen Xie, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/481,256

(22) Filed: Sep. 9, 2014

(65) Prior Publication Data
US 2015/0069015 A1    Mar. 12, 2015

Related U.S. Application Data

(60) Provisional application No. 61/875,896, filed on Sep. 10, 2013.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C30B 29/60* | (2006.01) |
| *C30B 19/12* | (2006.01) |
| *C30B 29/52* | (2006.01) |

(52) U.S. Cl.
CPC ............... *C30B 29/607* (2013.01); *C30B 19/12* (2013.01); *C30B 29/52* (2013.01)

(58) Field of Classification Search
CPC ..................................................... C30B 29/607
USPC ............................................................ 216/41
See application file for complete search history.

(56) References Cited

U.S. PATENT DOCUMENTS

2012/0034550 A1* 2/2012 Xia et al. ...................... 429/524

* cited by examiner

*Primary Examiner* — Roberts Culbert
(74) *Attorney, Agent, or Firm* — Bryan W. Bockhop; Bockhop & Associates, LLC

(57) ABSTRACT

In a method of generating a nanocrystal with a core-frame structure, a seed crystal, including a first substance, is exposed to a capping agent. The seed nanocrystal has a plurality of first portions that each has a first characteristic and a plurality of second portions that each has a second characteristic, different from the first characteristic. The capping agent has a tendency to adsorb to portions having the first characteristic and has a tendency not to adsorb to portions having the second characteristic. As a result, a selectively capped seed nanocrystal is generated. The selectively capped seed nanocrystal is exposed to a second substance that has a tendency to nucleate on the plurality of second portions and that does not have a tendency to nucleate on portions that have adsorbed the capping agent, thereby generating a frame structure from the plurality of second portions of the seed nanocrystal.

18 Claims, 3 Drawing Sheets

SPATIALLY-CONTROLLED SYNTHESIS OF PALLADIUM—RHODIUM HETERO-NANOSTRUCTURES

CROSS-REFERENCE TO RELATED APPLICATION(S)

This application claims the benefit of U.S. Provisional Patent Application Ser. No. 61/875,896, filed Sep. 10, 2013, the entirety of which is hereby incorporated herein by reference.

STATEMENT OF GOVERNMENT INTEREST

This invention was made with government support under agreement No. DMR-1215034, awarded by the National Science Foundation. The government has certain rights in the invention.

BACKGROUND OF THE INVENTION

1. Field of the Invention

The present invention relates to nanocrystal growth and, more specifically, to a method of generating nanocrystal frame structures.

2. Description of the Related Art

Manipulating the morphology, structure and composition of noble-metal nanocrystals offers a powerful means to tailor and improve their properties for a myriad of applications, such as catalysis, plasmonics, and biomedicine. In particular, bimetallic (and trimetallic) nanocrystals have drawn interest owning to their abundant variations in compositions and spatial distributions. Compared to monometallic nanocrystals, the electronic coupling between the two constituent metals of a bimetallic nanocrystal can dramatically improve their catalytic performance or even initiate new features. For example, the oxygen reduction reaction activity catalyzed by $Pt_3Ni$ {111} surface holds a 90-fold gain over the state-of-art Pt/C electrocatalyst. Moreover, the localized surface plasmon resonance peaks of Au—Ag nanocages can be tuned in a wide-range by adjusting the ratio of Au:Ag. These advances demonstrated the significance of rational design of bimetallic nanocrystals with new structures and highlighted properties to fit a specific application.

Therefore, there is a need for methods of controlling the morphology of bimetallic nanocrystals.

SUMMARY OF THE INVENTION

The disadvantages of the prior art are overcome by the present invention which, in one aspect, is a method of generating a nanocrystal with a core-frame structure, in which a seed crystal, including a first substance, is exposed to a capping agent. The seed nanocrystal has a plurality of first portions that each has a first characteristic and a plurality of second portions that each has a second characteristic, different from the first characteristic. The capping agent has a tendency to adsorb to portions having the first characteristic and has a tendency not to adsorb to portions having the second characteristic. As a result, a selectively capped seed nanocrystal is generated. The selectively capped seed nanocrystal is exposed to a second substance that has a tendency to nucleate on the plurality of second portions and that does not have a tendency to nucleate on portions that have adsorbed the capping agent, thereby generating a frame structure from the plurality of second portions of the seed nanocrystal.

In another aspect, the invention is a method of generating a cubic frame structure, in which a plurality of Pd (palladium) nanocrystals having a cubic shape is exposed to a solution including $Br^-$ (bromide) ions for a time sufficient so that the $Br^-$ ions are adsorbed to a {100} family of crystal facets on the Pd nanocrystals so as to form selectively capped nanocrystals. A solution including a salt precursor to Rh (rhodium) is added to the selectively capped nanocrystals at a rate that causes Rh atoms derived from the precursor to nucleate from edges and corners of the Pd nanocrystals so as to generate a core-frame structure affixed to the edges and corners of the Pd nanocrystals. Pd is then etched from the core-frame nanocrystals so as to leave a plurality of cubic Rh frame structures.

In yet another aspect, the invention is a method of generating a cuboctahedral core-frame structure, in which a plurality of Pd nanocrystals having a cuboctahedral shape is exposed to a solution including $Br^-$ ions for a sufficient time so that the $Br^-$ ions are adsorbed to a {100} family of crystal facets on the Pd nanocrystals so as to form selectively capped nanocrystals. A solution including a salt precursor to Rh is added to the selectively capped nanocrystals at a rate that causes Rh atoms to nucleate from a {111} family of crystal facets on the Pd nanocrystals so as to generate a frame structure affixed to the {111} family of crystal facets of the Pd nanocrystals.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
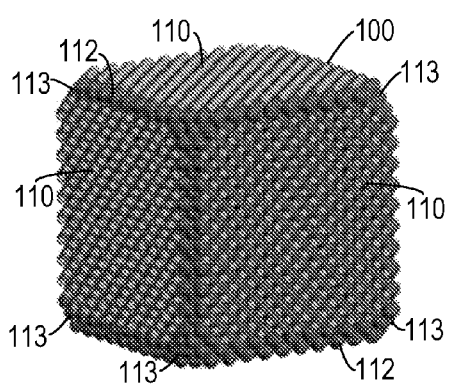
FIGS. 1A-1D are a series of perspective view schematic diagrams showing development of a cubic frame structure.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1B:
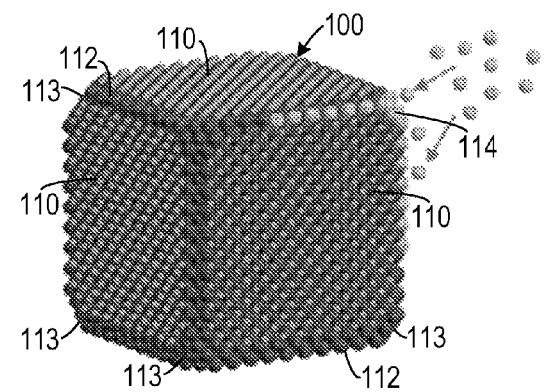
Figure 1C:
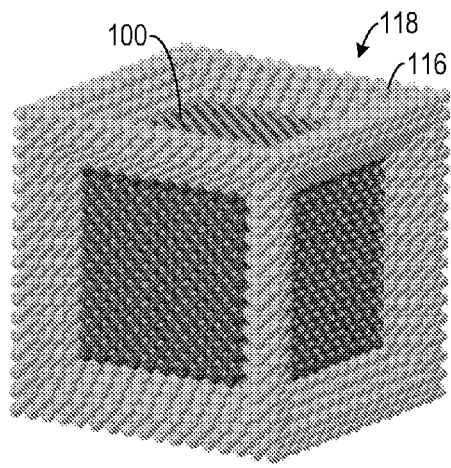
Figure 1D:
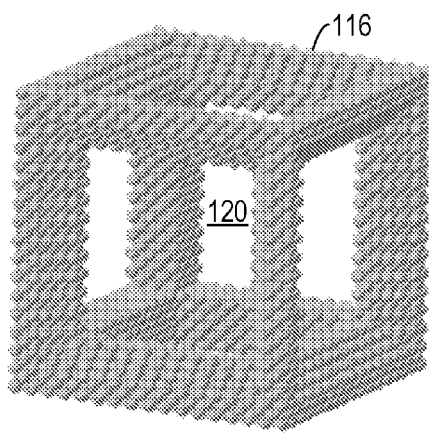
Figure 2A:
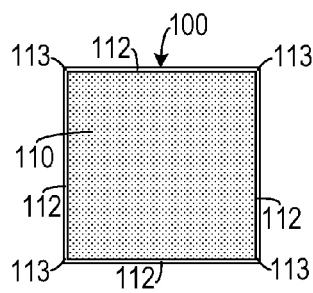
FIGS. 2A-2C are a series of plan view schematic diagrams showing development of a cubic frame structure.
Figure 2B:
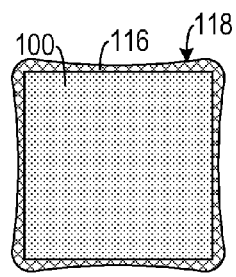
Figure 2C:
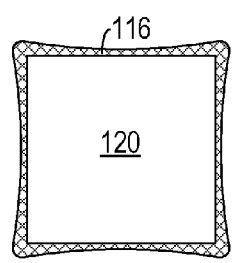

A Rh frame structure 118 can be generated by adsorbing a capping agent, such as a solution including bromide ions ($Br^-$) 110 to the {100} facets of at least one Pd seed nanocrystal 100, leaving the edges 112 and corners 113 uncapped, as shown in FIG. 1A and FIG. 2A. The nanocrystal 110 is then exposed to a solution that includes a Rh precursor 114, as shown in FIG. 1B. As a result, Rh atoms derived from the precursor will nucleate on the edges 112 and corners 113, thereby forming frame structure 116 around the Pd nanocrystal 100, as shown in FIG. 1C and FIG. 2B. The combined nanocrystal 100 and frame structure 116 is referred to as a "core-frame structure" 118. Pd can be etched from the coreframe structure 118 to leave a void 120 surrounded by the frame structure 116, as shown in FIG. 1D and FIG. 2C.

Figure 3A:
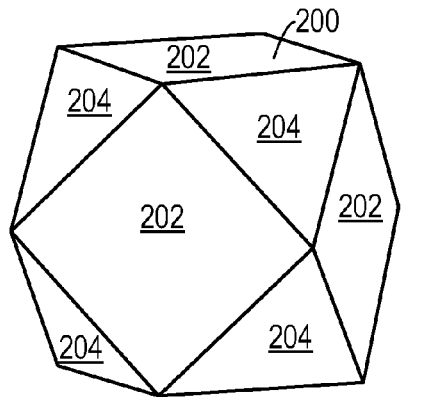
FIGS. 3A-3D are a series of perspective view schematic diagrams showing development of a cuboctahedral core-frame structure.
Figure 3B:
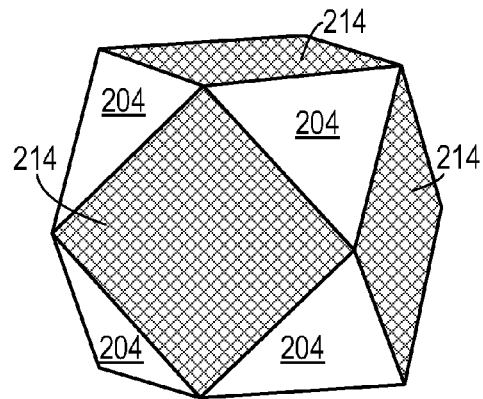
Figure 3C:
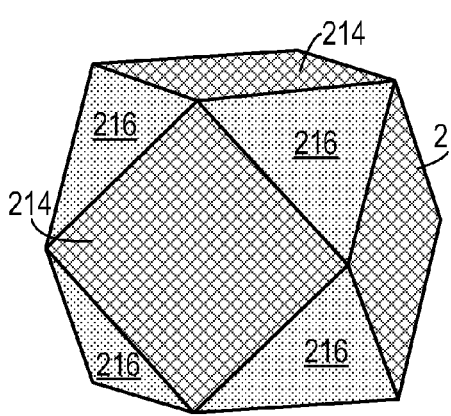
Figure 3D:
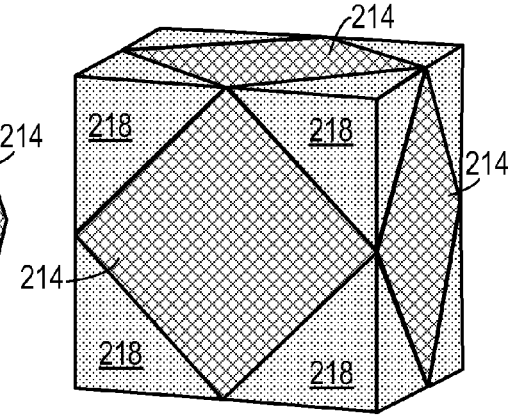

In one embodiment, as shown in FIGS. 3A-3B, a cuboctahedral Pd crystal 200 with six $\{100\}$ facets 202 and eight $\{111\}$ facets 204 can be exposed to a capping agent so that the capping agent 214 adheres to the $\{100\}$ facets 202. The capped crystal is then exposed to a Rh precursor, which results in Rh nucleation 216 on the $\{111\}$ facets 204. In one embodiment, if the Rh precursor is applied at a first rate and a relatively low temperature (e.g., Rh precursor applied at 4.0 mL/hour and 140° C.), then the nucleation will form islands of Rh on the exposed facets. In another embodiment, if the Rh precursor is applied at a second rate and a at a relatively high temperature (e.g., Rh precursor applied at 1.0 mL/hour and 180° C.), then the nucleation will demonstrated layered growth to form pyramids 218 extending from the exposed facets.

Figure 4:
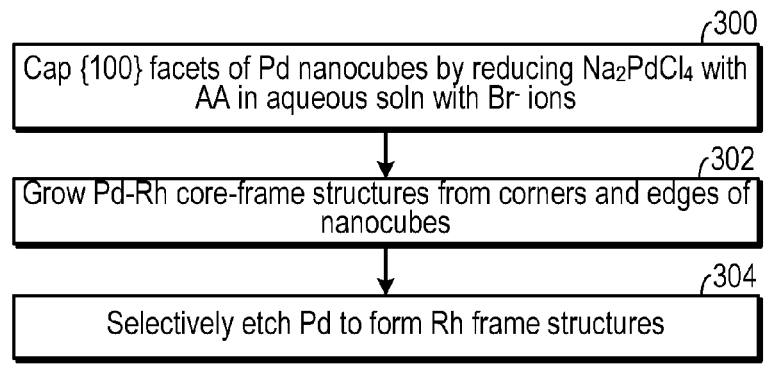
FIG. 4 is a flow chart demonstrating one method of making a frame structure.

In one embodiment, as shown in FIG. 4, the $\{100\}$ facets of Pd nanocubes are prepared by reducing $Na_2PdCl_4$ with L-ascorbic acid (AA) in an aqueous solution containing bromide ions 300. A Pd-Rh core-frame structure is grown from the corners and edges of the nanocubes 302 by exposing them to a salt precursor to Rh that includes $Na_3RhCl_6$ at a rate and temperature for an amount of time that will result in a desired core-frame structure morphology. Pd is selectively etched from the core-frame structure so as to leave a Rh frame structure 304.

Figure 5:
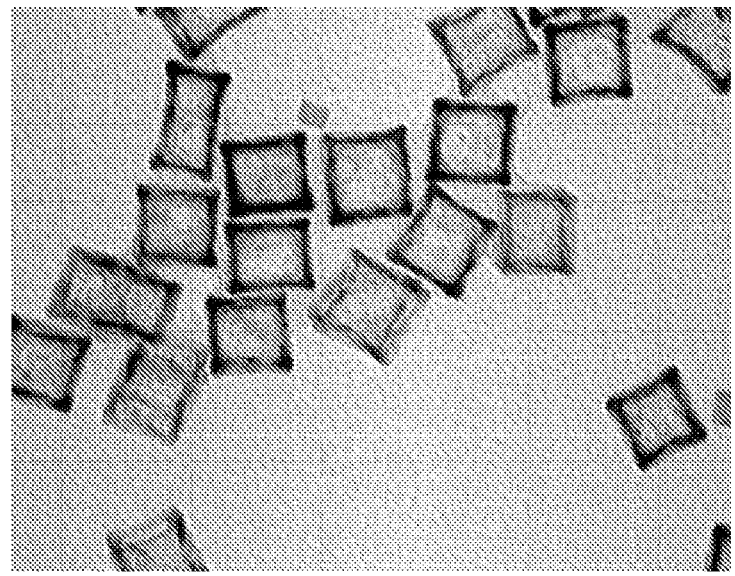
FIG. 5 is a micrograph of a plurality of cubic frame structures made in accordance with one embodiment of a method disclosed herein.
Figure 6:
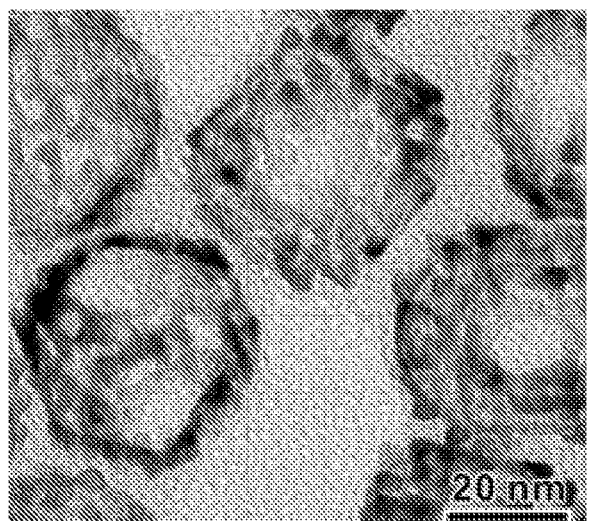
FIG. 6 is a micrograph of a plurality of cuboctahedral frame structures made in accordance with one embodiment of a method disclosed herein.

A cubic frame structure is shown in FIG. 5 and a cuboctahedral frame structure is shown in FIG. 6.

In one experimental embodiment, Pd—Rh bimetallic nanocrystals were made from cuboctahedral Pd seed nanocrystals. For investigating the site-selective overgrowth of the secondary metal atoms, a seed with more than one type of crystallographic facets was used, as such a seed crystal allows one to clarify the role of different crystallographic facets. Well-defined cuboctahedral Pd nanocrystals, which are enclosed by eight $\{111\}$ facets and six $\{100\}$ facets, were chosen as the seeds to conduct the overgrowth of Rh. Pd—Rh nanocrystals were obtained after the addition of 6.0 mL of $Na_3RhCl_6$ solution in ethylene glycol (EG) (2.5 mg/mL) with a syringe pump at 4.0 mL/h into a reaction solution, containing KBr as the capping agent, L-ascorbic acid (AA) as the reductant, and cuboctahedral Pd nanocrystals as the seeds. As a result, multi-pods were anchored on all the $\{111\}$ surface of the cuboctahedral Pd seeds, giving the cuboctahedral Pd-Rh nanocrystals a partially rough appearance. No Rh atoms nucleated on $\{100\}$ surfaces of the cuboctahedral Pd seeds. The main surface of the Rh portion was parallel to the $\{200\}$ plane, indicating the surface of the protruding Rh multi-pods were dominated by $\{100\}$ surface. The exposure of Rh$\{100\}$ surface could be attributed to the presence of $Br^-$ ions in the reaction solution, as $Br^-$ ions are specific capping agents for Rh(100) surface. The orientation of the overgrown Rh portions were identical with the Pd cuboctahedral seeds. The results confirmed the successful spatially-controlled overgrowth of Rh on the $\{111\}$ surfaces of the cuboctahedral Pd nanocrystals and the preservation of Pd$\{100\}$ surfaces.

Also monitored was the growth process of these cuboctahedral Pd—Rh nanocrystals when increasing amounts of $Na_3RhCl_6$ solution in EG were added into the reaction solution. Aliquots of the reaction solution were taken out at various stages. When a relatively small amount of $Na_3RhCl_6$ (1.0 mL, 2.5 mg/L) was introduced into the reaction solution in the presence of KBr, some salient islands emerged at the $\{111\}$ surfaces while the $\{100\}$ surfaces remained smooth. This observation demonstrated that the generated Rh atoms selectively deposited and nucleated on Pd$\{111\}$ surfaces at the early stage of the growth process. With the increasing addition of $Na_3RhCl_6$, the number of salient islands on each (111) facet was increased. Subsequently, the Rh salient islands continuously grew up, and finally formed multi-pods on each of the Pd (111) surfaces. During the entire overgrowth process, the Pd$\{100\}$ surfaces preserved smooth, resulting in a spatially-controlled overgrowth of Rh atoms on Pd$\{111\}$ surfaces. The slow adding rate of $Na_3RhCl_6$ was an important factor to avoid the self-nucleation of the newly generated Rh atoms and enable the Rh atoms to nucleate and grow on the Pd seeds. In this condition, as the concentration of the generated Rh atoms was much higher from the beginning, most of them preferentially self-nucleated and the following Rh atoms tended to grow on the small Rh seeds forming a large number of Rh nanocrystals. As a result, very few Rh atoms overgrew on the cuboctahedral Pd seeds. If the $Na_3RhCl_6$ solution was added at a slower rate (1.0 mL/h), the concentration of the generated Rh atoms was even lower. At the initial stage, there would be fewer nucleation sites on each of the Pd$\{111\}$ surface. The continuous growth of Rh was also slowed down. As a result, the number of the Rh pods on each of the Pd$\{111\}$ surface was decreased, giving the final cuboctahedral Pd—Rh nanocrystals a relative smooth appearance.

To further investigate the effect of different shapes of the Pd polyhedral seeds, octahedral Pd nanocrystals and cubic Pd nanocrystals were used as the seeds to conduct the synthesis of Pd—Rh bimetallic nanocrystals in the presence of KBr. For the octahedral Pd seeds, the surface was enclosed by eight Pd$\{111\}$ facets with small portion of $\{100\}$ facets on the slight truncated vertexes. After adding 6.0 mL of $Na_3RhCl_6$ solution (2.5 mg/mL), all the Pd$\{111\}$ surfaces were covered by a dense array of Rh salient pods, indicating the nucleation and deposition of the generated Rh atoms on the entire Pd $\{111\}$ surfaces. It was found that the small $\{100\}$ surfaces at the vertexes were still kept smooth. A number of Rh salient islands emerged on all the Pd $\{111\}$ surfaces, confirming the nucleation and then overgrowth process. Compared to octahedral-Pd nanocrystals, cubic Pd nanocrystals were enclosed by six $\{100\}$ surfaces with slight truncation at the corners and edges. The products turned to be Pd—Rh core-frame nanocubes with concave side faces. This core-frame concave structure was generated by a selective-deposition of Rh atoms only on the truncated corner and edge sites of the cubic Pd seeds.

The overgrowth of Rh atoms on Pd $\{100\}$ surfaces with the three different Pd polyhedrons as the seeds (cuboctahedral, octahedral, and cubic nanocrystals) were all debarred in the presence of KBr. Similar spatially-controlled Pd—Rh bimetallic nanocrystals could also be obtained when KBr was substituted by an equimolar amount of NaBr. This site-selective overgrowth of Rh atoms may be attributed to the blocking effect of $Br^-$ ions by capping the Pd $\{100\}$ facets. The addition of Bf ions can promote the formation of Pd $\{100\}$ facets by the capping effect. The cubic Pd seeds used in the overgrowth of Rh were also synthesized with the capping of Bf ions. And the cuboctahedral and octahedral Pd nanocrystals were obtained from a secondary growth of the preformed Br⁻-capped cubic Pd nanocrystals in an aqueous solution without the addition of extra Br⁻ ions.

The surface capping agents of metallic nanocrystals could affect their secondary growth or reactions. For example, the galvanic replacement reactions involved cubic metal templates could be precluded from starting at {100} surfaces by the protection of {100} with surface specific capping agents, such as PVP or hexadecylamine. For further illuminating the blocking effect of Br⁻ ions by capping on Pd {100} surface, a set of experiments was conducted to synthesize Pd—Rh bimetallic nanocrystals using the three different polyhedral Pd seeds, respectively, without the addition of KBr. During the reaction, the original layer of Br⁻ that capped on Pd {100} could dynamically drop out as the relative high temperature (140° C.), leading to the weakening or disappearance of blocking effect. Without the addition of extra KBr, both the {100} and {111} surfaces of the cuboctahedral Pd seeds were covered by a dense layer of Rh multi-pods. As a result, the integral morphology of the Pd—Rh bimetallic nanocrystals from cuboctahedral Pd nanocrystals was identical to that from the octahedral Pd seeds. In the absence of capping agent, the shape of these Rh multi-pods was irregular. When cubic Pd nanocrystals was applied as the seeds in the absence of KBr, beside on the corners and edges, Rh multi-pods also anchored on the side Pd{100} surfaces. This morphological transition illuminated the blocking effect of Br⁻ ions by capping on Pd{100} surface during the aforementioned spatially-controlled overgrowth of Rh on Pd polyhedral seeds.

The premise of this spatially-controlled synthesis of Pd—Rh bimetallic nanocrystals was the slow kinetics of generation of Rh atoms. As the reduction of $Na_3RhCl_6$ under this synthetic condition was extremely fast, the generation of Rh atoms could be completely manipulated by the injection rate of $Na_3RhCl_6$ solution. The $Na_3RhCl_6$ solution was added slowly (4 mL/h, 2.5 mg/mL) into the reacting system with a syringe pump. Once the $Na_3RhCl_6$ was added into the reaction solution, it was immediately reduced into Rh atoms, which then deposited on the Pd seeds. Therefore, the concentration of the newly generated Rh atoms was kept extremely low in the reaction solution, which could effectively avoid the self-nucleation and provide the Rh atoms the opportunity to nucleate and deposit on the surface of the Pd seeds and thus achieve the spatially-selective overgrowth.

All the exposed Pd{100} facets were capped and preserved by Br⁻ ions during the overgrowth process. The generated Rh atoms were caused to nucleate and deposit on the bare area, for example, {111} facets and truncated corners/edges. In a seed-mediate overgrowth for bimetallic nanocrystals, the difference of the bond dissociation energies between the two involved metal elements could largely affect their heterogeneous nucleation and growth modes. For example, Pd—Pt dendritic core-shell nanostructures could be obtained when Pt was reduced by a relative strong reducing agent and deposited on preformed Pd seeds because the bond dissociation energy of Pt—Pt bond (307 kJ/mol) is much higher than that of Pt—Pd (191 kJ/mol) and Pd—Pd bonds (136 kJ/mol). The heterogeneous nucleation and growth of Pt atoms on Pd surface was assigned to the island growth mode. The nucleation and growth of Rh on the substrate of Pd seeds also followed this island growth mode because of the relative high bond dissociation energy of Rh—Rh (285 kJ/mol) and the large surface free energies of Rh. When cuboctahedral Pd nanocrystals were applied as the seeds, because the Pd{100} surfaces were blocked by the capping Br⁻ ions, the generated Rh atoms were preferentially nucleated on Pd{111} surfaces with multi-sites forming salient Rh islands. And then the adding Rh atoms preferentially deposited and grew on these Rh islands as the strong Rh—Rh interaction, leaving Pd {100} surfaces uncovered. When octahedral Pd nanocrystals enclosed only by {111} facets were used as the seeds, the Rh atoms would nucleate and deposit on the entire surface. However, the generated Rh atoms could only deposit at the truncated corner and edge sites on the cubic Pd seeds, whose {100} facets were covered by Br⁻ ions. The migration of initially deposited Rh atoms was involved to minimize the surface free energy as the corner and edge sites are much higher in energy. The surface migration let to the formation of Rh faces with smooth surfaces.

Rh frames from Pd—Rh Bimetallic nanocrystals were generated through selective etching. One of the advantages from the spatial composition-separation of a hybrid bimetallic nanocrystal is the difference in reactivity between the two metal components. For instance, Rh possesses much higher oxidative corrosion resistance than Pd. The Pd cubic core could be selectively removed from the Pd—Rh core-frame nanocrystal to generate a cubic frame consisting of pure Rh. This selective-etching was conducted in an aqueous solution based on the oxidation etchant of $Fe^{3+}/Br^-$ pair. The structure of Pd—Rh bimetallic nanocrystals apparently determined the final structure of Rh nanoframes. The Rh nanoframes from cuboctahedral Pd—Rh nanocrystals, octahedral-Pd—Rh nanocrystals and cubic Pd—Rh nanocrystals are referred to herein as cuboctahedral Rh NFs, octahedral Rh NFs and Cub-Rh NFs, respectively. For the cuboctahedral Rh NFs, as no Rh grew on the {100} facets of the Pd cores, large caves emerged at the region of bare Pd{100} facets after the dissolution of Pd cores. For the octahedral Rh NFs, all the frame walls consisted of a dense array of Rh pods without apparent holes on the surface, taking an integral octahedral nanocage structure. As the entire {100} surfaces of Pd cores were exposed in cubic Pd—Rh nanocrystals, the cubic Rh NFs resulted in a cubic skeleton frame structure with great open degree after the removal of Pd cores. These Rh frame structures may have great potential in catalytic applications owning to their large surface area and unique hollow/open structures.

Spatially-controlled synthesis of Pd-Rh nanocrystals was achieved through a site-selective overgrowth of Rh atoms on polyhedral Pd seeds. Three types of Pd polyhedrons, including Pd cuboctahedrons, Pd octahedrons and Pd cubes, have been applied as the seeds to illuminate the effects of the seed shapes and the capping agents. Under the kinetic control and the presence of Br⁻ ions, Rh atoms selectively nucleated and deposited on the {111} facets of cuboctahedral Pd and octahedral Pd seeds, or only at the corner and edge sites of cubic Pd seeds. This selective overgrowth of Rh on Pd seeds followed an island growth mode owing to the relative high bond dissociation energy of Rh—Rh and large surface free energies of Rh. This mechanistic study confirmed the slow addition of $Na_3RhCl_6$ solution can efficiently avoid the self-nucleation of the generated Rh atoms, offering them the opportunity to deposition on Pd seeds. More importantly, XPS studies indicated that the Br⁻ ions specifically capped on Pd(100) surface, which could play as an obstacle preventing the deposition of Rh atoms on the {100} facets of the Pd seeds. At the end, we selectively removed the Pd cores from the three types of Pd—Rh bimetallic nanocrystals with different elemental spatial-distribution, generating three corresponding Rh frames with different open structures. Our study provides a rational platform for the design of bimetallic nanocrystals with hetero-nanostructures through seed-mediated approaches.

In the experimental embodiments, the following chemicals and materials were used. Ethylene glycol (EG, lot no.

K43B24) was purchased from J. T. Baker. Sodium Pd(II) tetrachloride ($Na_2PdCl_4$, 99.998%), sodium Rh (III) hexachloride ($Na_3RhCl_6$), poly(vinyl pyrrolidone) (PVP, MW≈55,000), L-ascorbic acid (AA), potassium bromide (KBr), formaldehyde (HCHO, 37 wt. % in $H_2O$), hydrochloric acid (HCl, 37%), and iron(III) chloride (97%) were all obtained from Sigma-Aldrich and used as received. All aqueous solutions were prepared using deionized (DI) water with a resistivity of 18.2 MΩ·cm.

The following procedure was employed in the synthesis of 18-nm Pd nanocubes. The 18-nm Pd nanocubes used as the seeds were synthesized by adding a $Na_2PdCl_4$ solution into an aqueous solution containing PVP, AA and KBr. Typically, 105 mg of PVP, 60 mg of AA, 600 mg of KBr, and 8.0 mL of DI water were mixed in a vial and preheated at 80° C. in an oil bath under magnetic stirring for 10 min. Subsequently, 57 mg of $Na_2PdCl_4$ was dissolved in 3.0 mL of DI water and then injected into the preheated solution with a pipette. The mixture of reagents was capped, and maintained at 80° C. for 3 h. The product was collected by centrifugations, washed three times with water to remove excess PVP and inorganic ions, and then re-dispersed in 11 mL of solvent (EG or DI water).

The following procedure was employed in the synthesis of Pd cuboctahedrons and octahedrons. The Pd cuboctahedrons and octahedrons were synthesized through a seed-mediated approach as our previous report. In a standard procedure, 8.0 mL of an aqueous solution containing 105 mg of PVP, 100 µL of HCHO, and 0.3 mL of an aqueous suspension (1.8 mg/mL in concentration) of 18-nm Pd nanocubes was preheated at 60° C. for 5 min under magnetic stirring in a capped vial. Then, 3.0 mL of aqueous $Na_2PdCl_4$ solution was injected into the mixture through a pipette. The weight amounts of $Na_2PdCl_4$ for obtaining cuboctahedrons and octahedrons were 8.7 mg and 29.0 mg, respectively. The reaction was maintained at 60° C. for 3 h. The products were collected by centrifugation, washed two times with water, and then re-dispersed in 1.0 mL of EG.

The following procedure was employed in the synthesis of spatially-controlled Pd—Rh bimetallic nanocrystals. The spatially-controlled synthesis of Pd—Rh bimetallic nanocrystals was conducted by introducing $Na_3RhCl_6$ solution (in EG) into the reaction system which contained the polyhedral Pd seeds. Typically, 52.8 mg of L-ascorbic acid, 54 mg of KBr, 1.0 mL of polyhedral Pd seeds (e.g., cuboctahedrons, octahedrons, and nanocubes) in EG, and 6.0 mL of EG were mixed together in a 50 mL three-neck flask. The mixture was preheated at 110° C. for 2 h under magnetic stirring, and then ramped to 140° C. Meanwhile, 15 mg of $Na_3RhCl_6$ and 133 mg of PVP were separately dissolved in 6 mL of EG. Then, both of the EG solutions were pumped into the preheated mixture under 140° C. at the same rate of 4.0 mL/h. The reaction took additional 10 min after the pumping. The product was collected by centrifugation, washed two times with ethanol and then three times with water, and then re-dispersed in 5 mL of DI water.

The following procedure was employed in the synthesis of Rh frames. Chemical etching was conducted towards the three Pd—Rh bimetallic nanocrystals in an acidic aqueous solution to prepare Rh frames. Typically, 300 mg of KBr, 50 mg of PVP, 50 mg of $FeCl_3$, 0.3 mL of HCl (37%), 5.7 mL of DI water, and 2.0 mL of the aqueous dispersion of the as-prepared Pd—Rh bimetallic nanocrystals were mixed together in a 50-mL flask. Then, the mixture was heated at 100° C. in an oil bath under magnetic stirring. After 48 h, the products were collected by centrifugation, washed two times with ethanol and three times with water, and then re-dispersed in DI water.

These methods represent a new approach to the syntheses of core-frame nanocrystals and their further conversion into frame-like nanostructures. Two types of metals can be presented on the surface of such a core-frame nanocrystal in a spatially well-defined pattern. The products can be important to a variety of catalytic applications, especially for catalytic converters used in automobiles, petroleum refinery, and pharmaceutical industry.

The technology based on the site-selected deposition of one metal on the surface a seed made of the same or a different metal. It involves a capping agent that can selectively adsorb onto a specific type of facets on the surface of a seed and thus block these facets from receiving additional atoms from the solution during the growth process. In addition, the surface diffusion of adatoms should be suppressed to help confine the atoms to the originally deposited sites.

This involves selective deposition of Rh atoms onto the corners and edges of Pd nanocubes (i.e., the seeds). In such a synthesis, $Br^-$ ions (as well as other halide ions such as iodide) were found to play an important role in selectively blocking the {100} side faces on a Pd nanocube. As such, only the corner and edge sites on the surface of a Pd nanocube can receive new atoms from the reaction solution. When a salt precursor to Rh was slowly injected into the reaction solution through a syringe pump, the deposition of Rh atoms could be tightly confined only to the corners and edges of the Pd nanocubes, generating Pd—Rh core-frame nanocubes with concave side faces. The same approach can also be extended to other platinum group metals, including Pt (platinum), Ir (iridium), and Pd (palladium).

As one of the many applications, the core-frame structure may offer a new approach to increasing the shape stability and thus catalytic activities of noble-metal nanocrystals at elevated temperatures. It was found that the Pd—Rh core-frame nanocubes could be maintained with a cubic shape up to a much higher temperature as compared with Pd nanocubes. Therefore, the Pd—Rh core-frame nanocubes are anticipated to exhibit improved catalytic durability in a catalytic reaction at a high temperature.

This technology can also be extended to a variety of Pd seeds with other types of polyhedral shapes. When Pd cuboctahedrons were used as the seeds to conduct the growth, the nucleation and deposition of Rh atoms was confined solely to the {111} facets of a Pd seed, because the {100} facets were selectively capped by a layer of chemisorbed $Br^-$ or $I^-$ ions. When the synthesis was conducted at a relative low temperature, the deposition of Rh atoms would follow an island growth mode due to the high Rh—Rh interatomic binding energy. The surface diffusion of deposited Rh atoms can be facilitated by increasing the reaction temperature. Under this condition, the deposition of Rh on the Pd{111} facets was switched to a layered growth mode. A variety of other types of polyhedral Pd seeds that contained Pd{111} and Pd{100} facets in different proportions on the surface were also applied to the synthesis. A series of Pd-Rh bimetallic nanocrystals with distinctive elemental distributions on the surface were obtained. The Pd cores can be removed via selective chemical etching to generate Rh frames with different types and degrees of porosity.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of generating a nanocrystal with a core-frame structure, comprising the steps of:
    (a) exposing a seed crystal, comprising a first substance, to a capping agent, the seed nanocrystal having a plurality of first portions having a first characteristic and a plurality of second portions having a second characteristic, different from the first characteristic, wherein the capping agent has a tendency to adsorb to portions having the first characteristic and having a tendency not to adsorb to portions having the second characteristic, thereby generating a selectively capped seed nanocrystal; and
    (b) exposing the selectively capped seed nanocrystal to a second substance that has a tendency to nucleate on the plurality of second portions and that does not have a tendency to nucleate on portions that have adsorbed the capping agent, thereby generating a frame structure from the plurality of second portions of the seed nanocrystal.

2. The method of claim 1, further comprising the step of etching the seed nanocrystal with an etchant that is configured to remove the first substance from the frame structure.

3. The method of claim 1, wherein the plurality of second portions comprise a selected family of edges and corners.

4. The method of claim 1, wherein the plurality of first portions comprise {100} families of crystal facets.

5. The method of claim 4, wherein the seed nanocrystal has a cubic shape and wherein the selected family of crystal facets comprises a {100} family of facets.

6. The method of claim 4, wherein the seed nanocrystal has a cuboctahedral shape.

7. The method of claim 6, wherein the plurality of second portions comprises {111} families of facets.

8. The method of claim 1, wherein the first substance comprises Pd and wherein the second substance comprises a salt precursor to Rh.

9. The method of claim 8, wherein the salt precursor to Rh comprises $Na_3RhCl_6$.

10. The method of claim 1, further comprising the step of selecting the first substance and the second substance so that the frame structure is configured to be used as a catalyst in a predetermined catalytic reaction.

11. The method of claim 1, wherein the capping agent comprises a solution including halide ions.

12. The method of claim 11, wherein the halide ions include $Br^-$ ions.

13. The method of claim 1, wherein the seed nanocrystal comprises a nanocrystal selected from a group consisting of: a cubic nanocrystal; an octahedral nanocrystal; and a cuboctahedral nanocrystal.

14. A method of generating a cubic frame structure, comprising the steps of:
    (a) exposing a plurality of Pd nanocrystals having a cubic shape to a solution including $Br^-$ ions for a sufficient time so that the $Br^-$ ions are adsorbed to a {100} family of crystal facets on the Pd nanocrystals so as to form selectively capped nanocrystals;
    (b) adding a solution including a salt precursor to Rh to the selectively capped nanocrystals at a rate that causes Rh to nucleate from edges and corners of the Pd nanocrystals so as to generate a frame structure affixed to the edges and corners of the Pd nanocrystals; and
    (c) etching Pd from the Pd nanocrystals so as to leave a plurality of cubic Rh frame structures.

15. The method of claim 14, wherein the salt precursor to Rh includes $Na_3RhCl_6$.

16. A method of generating a cuboctahedral core-frame structure, comprising the steps of:
    (a) exposing a plurality of Pd nanocrystals having a cuboctahedral shape to a solution including $Br^-$ ions for a sufficient time so that the $Br^-$ ions are adsorbed to a {100} family of crystal facets on the Pd nanocrystals so as to form selectively capped nanocrystals; and
    (b) adding a solution including a salt precursor to Rh to the selectively capped nanocrystals at a rate that causes Rh to nucleate from a {111} family of crystal facets on the Pd nanocrystals so as to generate a frame structure affixed to the {111} family of crystal facets of the Pd nanocrystals.

17. The method of claim 16, further comprising the step of etching Pd from the Pd nanocrystals so as to leave a plurality of cuboctahedral Rh frame structures.

18. The method of claim 16, wherein the salt precursor to Rh includes $Na_3RhCl_6$.

* * * * *